United States Patent [19]
Latal et al.

[11] Patent Number: 5,934,916
[45] Date of Patent: Aug. 10, 1999

[54] PRINTED CIRCUIT BOARD MOUNTING RAIL MEMBER AND GROUND CLIP ASSEMBLY

[75] Inventors: James F. Latal, Palatine; Dorothy E. Kruglick, Arlington Heights, both of Ill.; Michael G. Whitney, Henderson, Nev.; Richard C. Francke, Bartlett Lakes Estates, Ill.

[73] Assignee: Illinois Tool Works Inc., Glenview, Ill.

[21] Appl. No.: 09/028,719

[22] Filed: Feb. 24, 1998

[51] Int. Cl.⁶ ...................................... H01R 4/66
[52] U.S. Cl. .................. 439/95; 439/78; 361/801
[58] Field of Search ................... 439/95–97, 92, 439/34.7, 61, 377, 108–119, 78–84; 361/737, 736, 740, 758, 759, 801, 802, 747; 174/35 R, 35 TS, 35 GC, 35 C

[56] References Cited

U.S. PATENT DOCUMENTS 4,855,873  8/1989  Bhargava et al. .
5,311,408  5/1994  Ferchau et al. .
5,333,100  7/1994  Anhalt et al. .
5,467,254  11/1995 Brusati et al. .
5,537,294  7/1996  Siwinski .
5,546,280  8/1996  Hasebe et al. .
5,584,706  12/1996 Hung .
5,590,028  12/1996 Duncan .
5,652,697  7/1997  Le .
5,672,844  9/1997  Persson et al. .

OTHER PUBLICATIONS

Intel, NLX Motherboard Specification, 1997, pp. 1–67.
ITW Fastex, "Electronic Solutions" product brochure, May 1997, pp. 1–4.

Primary Examiner—Lincoln Donovan
Attorney, Agent, or Firm—Schwartz & Weinrieb

[57] ABSTRACT

A rail member and ground clip assembly useable for mechanically and electrically coupling printed circuit boards to a chassis. The assembly has a stud protruding into an electrical contact opening in the rail member, a first end portion of the resilient electrical contact is disposed on a fastener boss proximate the electrical contact opening, a bifurcated curved portion of the resilient electrical contact protrudes at least partially through the electrical contact opening beyond a bottom side of the rail member, and the stud is disposed through an opening in the resilient electrical contact to engagably couple the resilient electrical contact to the rail member. The resilient electrical contact also includes a compression wave portion between the first end portion and the curved portion to bias the curved portion into engagement with the chassis. A non-threaded rivet fastens the rail member to the printed circuit board.

20 Claims, 3 Drawing Sheets

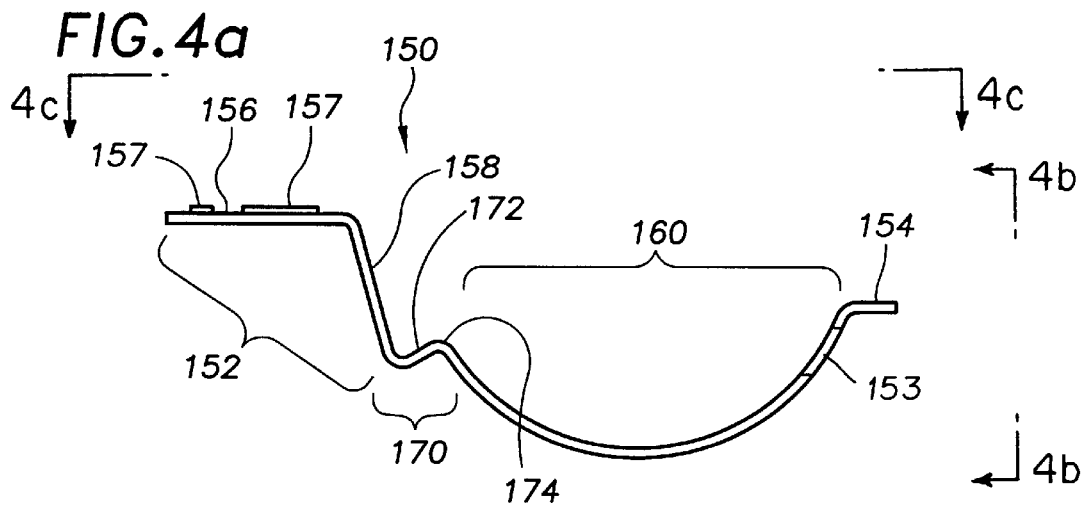
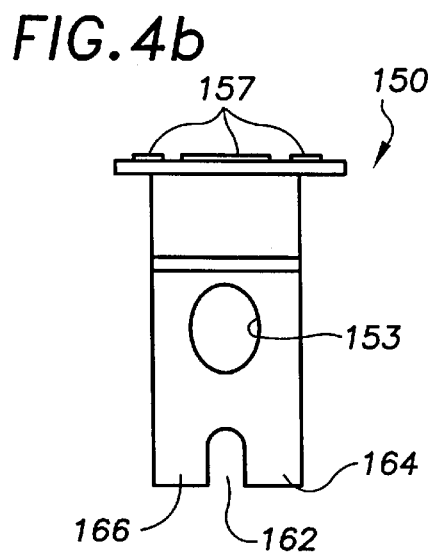
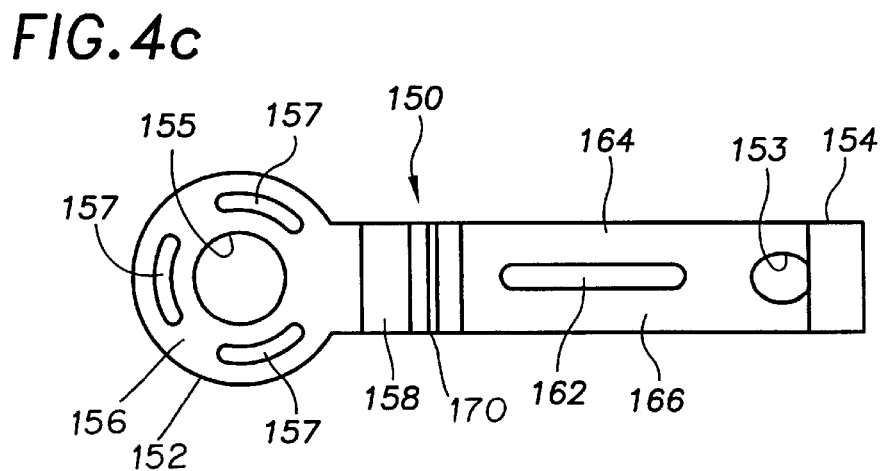

PRINTED CIRCUIT BOARD MOUNTING RAIL MEMBER AND GROUND CLIP ASSEMBLY

FIELD OF THE INVENTION

The present invention relates generally to mounting printed circuit boards on chassis, and more particularly to rail member and resilient electrical contact assemblies useable for mechanically and electrically coupling printed circuit boards to electrically conductive chassis.

BACKGROUND OF THE INVENTION

Electronic equipment including personal computers, audio and video equipment, electronic and medical diagnostic equipment among others generally include one or more printed circuit boards having various analog and digital electronic devices mounted thereon. The printed circuit boards are usually mounted and housed in an electrically grounded conductive cabinet, or chassis, which provides electromagnetic interference and electrostatic discharge shielding therefor, as is known.

In the personal computing industry, for example, a printed circuit board, referred to commonly as a motherboard, is mechanically and electrically coupled to a chassis and often to another printed circuit board, sometimes called a riser card, transversely mounted in the chassis relative thereto. In the past, motherboards, and printed circuit boards generally, were fastened with screw fasteners to threaded bosses protruding from the chassis interior. Some screws and bosses are metal thereby also providing an electrical coupling between the circuit board and the chassis. Screw fasteners however are susceptible to over-torquing, which may damage the circuit board. Misguided screw driving tools are another source of potential damage to the circuit board. Installation of screw fasteners, moreover, is often performed manually and is a suspected cause of physical maladies such as carpel tunnel syndrome.

U.S. Pat. No. 5,467,254 issued Nov. 14, 1995 and entitled "Supportive Guide for Circuit-Card Grounding Including Tracks Having Staggered Protrusions At The Proximal End of the Tracks" discloses printed circuit cards slidably disposed between rail members engagably mounted onto a computer chassis.

The personal computer industry has recently proposed the NLX Motherboard Specification, which includes a standard for mounting the motherboard in a computer chassis with a rail member. FIG. 5 of the present patent specification is a partial sectional view of a prior art rail member and ground clip assembly according to the NLX Motherboard Specification. The rail member 10 includes a ground clip 20 with a first end portion 22 disposed on a mounting surface 12 of a threaded screw boss 14 and in contact with a metal lead on a circuit board 30. A screw fastener, not shown, is disposed through an opening 32 in the circuit board 30 and into the threaded screw boss 14 so as to fasten the rail member 10 to the circuit board 30. A distal tip portion 24 of the ground clip 20 is retained in a slot 16 formed in the rail member 10, and an intermediate portion 26 of the ground clip 20 is biased into engagement with a chassis 34, thereby providing an electrical coupling between the circuit board 30 and the chassis 34.

To assemble the prior art NLX Specification ground clip 20, it must be disposed through a first opening and along a serpentine path in the rail member 10 and flexed prior to inserting the tip portion 24 thereof into the retention slot 16. This task is not readily performed in automated assembly operations, and when performed manually is arduous and likely a source of cumulative fatigue disorders. Also, fabrication of the first opening, the serpentine path, and the retention slot is costly, resulting from the relatively complex mold apparatus required. The prior art ground clip 20 also has a tendency to become misaligned relative to the rail member 10 prior to fastening the printed circuit board 30 thereon, complicating the process of fastening the rail member 10 to the circuit board 30. Additionally, the resiliency of the prior art NLX ground clip 20 has a tendency to degrade over time, particularly after repeated installations. Degradation of ground clip resiliency adversely affects the integrity of the electrical coupling with the chassis 34, resulting in increased contact impedance and resulting possibly in an open circuit condition. Also, the NLX rail member 10 is fastened with screw fasteners to the circuit board 30, which therefore remains subject to damage from over-torqued screws and misguided fastener tools.

The present invention is drawn generally toward advancements in the art of rail member and resilient electrical contact assemblies useable for mechanically and electrically coupling printed circuit boards to electrically conductive chassis.

It is an object of the invention to provide novel rail member and electrical contact assemblies that overcome problems in the prior art, that are economical, and that comply with the NLX Motherboard Specification.

It is another object of the invention to provide novel rail member and electrical contact assemblies that are relatively easy to assemble, both manually and especially in automated assembly operations.

It is also an object of the invention to provide novel rail member and electrical contact assemblies wherein the electrical contact is positively located and securely retained by the rail member, particularly the alignment of the electrical contact with a fastener bore of the rail member, prior to fastening the rail member to a printed circuit board.

It is a further object of the invention to provide novel rail members with improved electrical contacts, and more particularly resilient electrical contacts that are relatively firmly biased against the chassis, and resilient electrical contacts that are less likely to set, or lose resiliency, after prolonged use, thereby providing a relatively improved electrical coupling with the chassis.

It is another object of the invention to provide novel rail member and electrical contact assemblies that are relatively simply and quickly fastenable to printed circuit boards without tools, and without the risk of damage associated with over-torqued screw fasteners and misguided fastener driving tools.

It is a more particular object of the invention to provide novel rail member and resilient electrical contact assemblies comprising a stud protruding into an electrical contact opening of the rail member, wherein a first end portion of the electrical contact is disposed on a fastener boss proximate the electrical contact opening, a curved portion of the electrical contact protrudes at least partially through the electrical contact opening beyond a bottom side of the rail member, and the stud is disposed through an opening in the electrical contact so as to engagably couple the electrical contact to the rail member.

It is another more particular object of the invention to provide novel rail members having resilient electrical contacts with a first end portion disposed on a fastener boss, a curved portion of the electrical contact protruding at least partially through the electrical contact opening beyond the bottom side of the rail member, and a compression wave portion between the first end portion and the curved portion of the electrical contact for firmly biasing the curved portion thereof toward the chassis.

It is yet another more particular object of the invention to provide novel rail members fastenable to printed circuit boards with non-threaded rivet fasteners having a fastener body portion disposed and retained in a fastener bore of the rail member so that a partially split resilient head protrudes beyond the top side of the rail member and through an aperture in the circuit board. A fastener pin is retainably disposable into a bore of the fastener body portion and between the partially split resilient head thereof from the bottom side of the rail member so as to secure the circuit board to the fastener body portion.

BRIEF DESCRIPTION OF THE DRAWINGS

These and other objects, features and advantages of the present invention will become more fully apparent upon careful consideration of the following Detailed Description of the Invention and the accompanying Drawings, which may be disproportionate for ease of understanding, wherein like structure and steps are referenced generally by corresponding numerals and indicators throughout the several views, and wherein:

FIG. 4a is a side plan view of an electrical contact for use with the rail member according to the present invention.

FIG. 4b is an end view along lines b—b of FIG. 4a.

FIG. 4c is a top plan view along lines c—c of FIG. 4a.

DETAILED DESCRIPTION OF THE INVENTION

Figure 1:
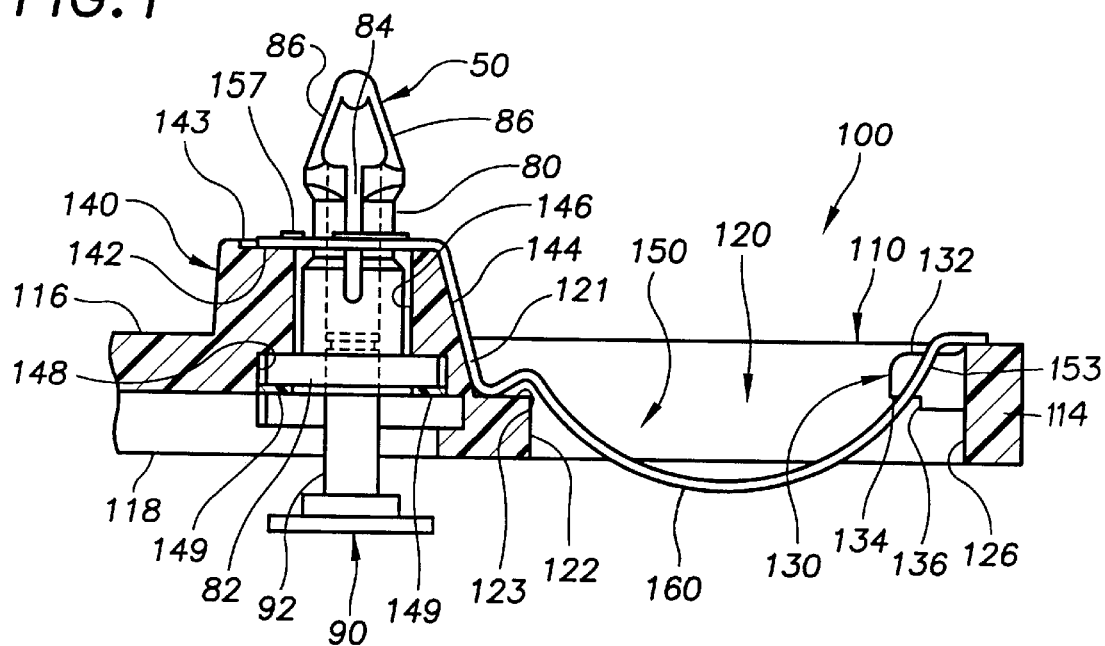
FIG. 1 is a partial sectional view of an un-installed rail member and electrical contact assembly according to the present invention.
Figure 3:
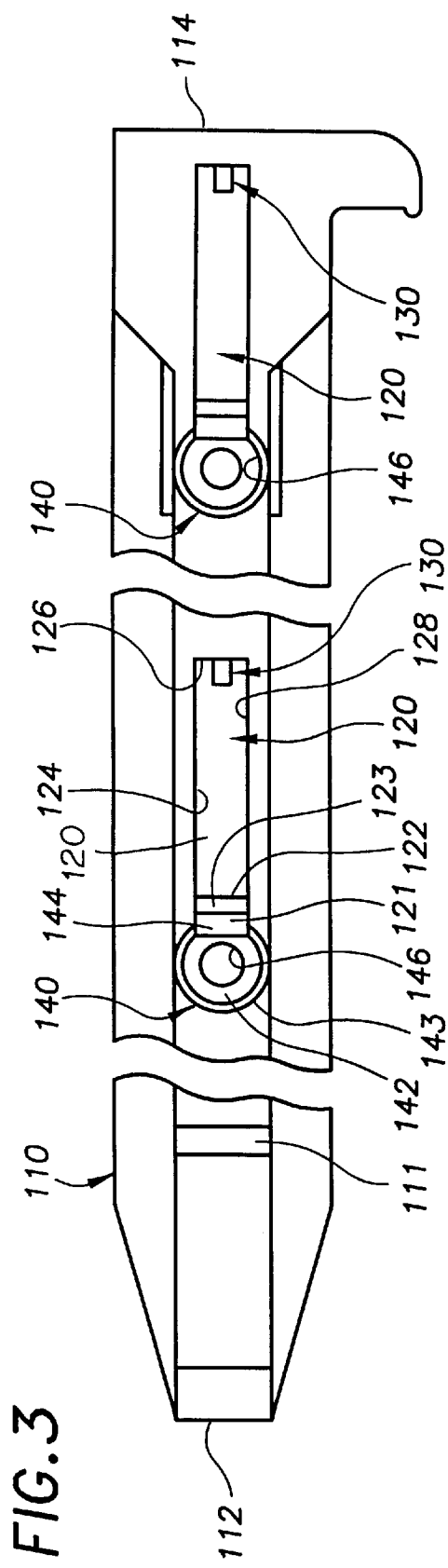
FIG. 3 is a partial top plan view of a rail member according to the present invention.

FIG. 1 illustrates an un-installed rail member and electrical contact assembly 100 according to the present invention, and FIG. 3 illustrates the rail member portion thereof. The assembly 100 generally comprises an elongate rail member 110 having a longitudinal dimension with a first end 112, an opposing second end 114, a top side 116, and a bottom side 118.

The rail member may be fabricated from any insulating material, though it is preferably formed of a plastic material, such as nylon 66, in a molding operation. The NLX Motherboard Specification, incorporated herein by reference, imposes various dimensional constraints on the rail member 110 including generally a length of 8.00 inches, a maximum height of 0.305 inches, and outer width of 0.650 inches and an inner width of 0.350 inches.

One or more electrical contact openings 120 are defined by corresponding interior side walls 122, 124, 126 and 128 extending through the rail member 110 between the top and bottom sides 116 and 118 thereof. A stud 130 protrudes into each electrical contact opening 120. In the exemplary embodiment, the stud 130 protrudes from the interior side wall 126 of the electrical contact opening 120 located toward the second end 114 of the rail member 110. The stud 130 preferably includes a bevelled or curved upper edge 132 to facilitate assembly of an electrical contact therein as discussed further below. The stud 130 may also include a relatively flat lower surface 134 and an edge 136 for engaging and locating the electrical contact, particularly when the electrical contact is under compression as discussed further below. The electrical contact opening 120 in the rail member 110 of the present invention is relatively economical to fabricate in comparison to the serpentine openings in the prior art NLX rail member, and greatly facilitates assembly of the electrical contact therein also discussed further below.

One or more fastener bosses 140 protrude from the top side 116 of the rail member 110 and are located proximate a corresponding electrical contact opening 120, and more particularly proximate a first interior side wall 122 located toward the first end 112 of the rail member 110. The fastener boss 140 also includes a mounting surface 142, which is preferably recessed below a partially circumferential upper edge portion 143 thereof. In the exemplary embodiment, an outer side wall portion 144 of the fastener boss 140 extends from the mounting surface 142 in an area devoid of the upper edge 143 toward the electrical contact opening 120 and forms a first interior side wall portion 121 thereof. The outer side wall portion 144 of the fastener boss 140 preferably slopes downwardly at an angle toward and terminates at a protruding step 123 in the electrical contact opening 120.

Figure 2:
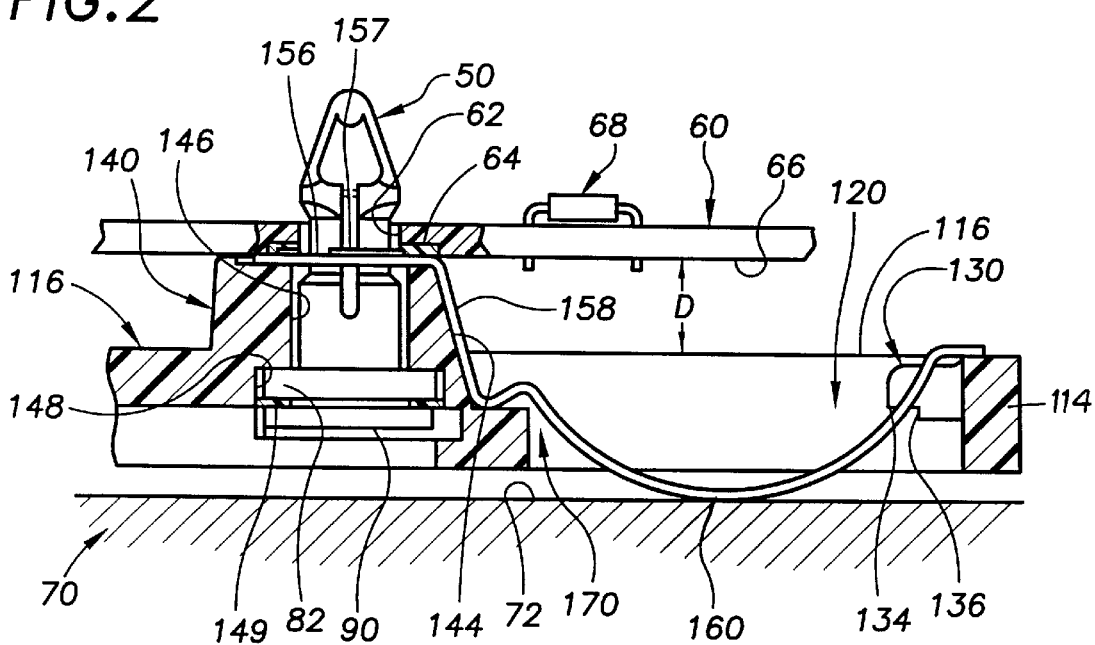
FIG. 2 is a partial sectional view of a rail member and electrical contact assembly mechanically and electrically coupling a printed circuit board to a chassis.

Each fastener boss 140 has a corresponding fastener bore 146 extending at least partially into the fastener boss 140. FIGS. 1 and 2 illustrate the fastener bore 146 accommodating a fastener 50 for fastening the rail member 110 to a printed circuit board 60, which is shown in FIG. 2. In the exemplary embodiment the fastener bore 146 extends fully through the rail member 110 between the top and bottom sides 116 and 118 thereof, and accommodates a two-part fastener known commercially as a Micro Tuflok® Rivet available from ITW Fastex, an Illinois Tool Works Company, Des Plaines, Ill. The exemplary Micro Tuflok® Rivet may be installed relatively quickly and without tools, thereby reducing assembly time and the possibility of damage to the circuit board 60 from over-torquing and misguided driving tools. The fastener bore 146 may alternatively be threaded for accommodating a screw fastener.

FIGS. 1 and 2 illustrates a resilient electrical contact 150, or ground clip, disposed generally in the electrical contact opening 120 of the rail member 110. FIGS. 4a, 4b and 4c illustrate the contact 150 having a first end portion 152, a second opposing end portion 154, and a curved portion 160 intermediate the first and second end portions thereof. Generally, the first end portion 152 of the resilient electrical contact 150 is disposed on the fastener boss 140, and the second end portion 154 is coupled to an opposing side 126 of the electrical contact opening 120 toward the second end 114 of the rail member 110 so that the curved portion 160 protrudes at least partially through the electrical contact opening 120 beyond the bottom side 118 of the rail member 110.

The resilient electrical contact 150 includes an opening 153 disposed toward the second end portion 154 thereof, and the stud 130 is disposed through the opening 153 so as to engagably couple the resilient electrical contact 150 to the rail member 110. The contact 150 is readily assembled with the rail member 110 by inserting the contact 150 through the contact opening 120 from the top side 116 of the rail member 110 so that the stud 130 protrudes into the opening 153 in the contact 150. Assembly may require slight flexing of the resilient electrical contact 150. The curved upper surface 132 of the stud 130 facilitates insertion of the contact 150, particularly the curved portion 160 thereof, into the opening 120 as the stud 130 is disposed into the opening 153 thereof. Thereafter, the contact 150 is relatively accurately aligned and securely retained in the opening 120. The assembly process is relatively simple and quick in comparison to prior art assembly procedures that require feeding the contact along a serpentine path. Additionally, the resilient electrical contact 150 of the present invention may be assembled readily in automated operations.

The first end portion 152 of the resilient electrical contact 150 includes a first flange 156 disposed on the mounting surface 142 of the fastener boss 140. FIG. 4c illustrates the first flange 156 of the resilient electrical contact 150 including an aperture 155, which is aligned substantially with the fastener bore 146 when the first flange 156 is disposed on the mounting surface 142 of the fastener boss 140, as shown in FIGS. 1 and 2. In the preferred exemplary embodiment, the first flange 156 is disposed on the recessed mounting surface 142 of the fastener boss 140 so that at least a portion of the first flange 156 of the resilient electrical contact 150 protrudes above the upper edge 143 of the fastener boss 140 as shown in FIGS. 1 and 2. The recessed mounting surface 142, and more particularly the upper edge 143 partially disposed circumferentially about the mounting surface 142 positively locates the first flange 156 on the mounting surface 142, and cooperates with the stud 130 to ensure accurate alignment of the aperture 155 and the fastener bore 146 prior to fastening the rail member 110 to a printed circuit board.

FIGS. 4a–4c illustrate the first flange 156 of the resilient electrical contact preferably including a plurality of raised bosses 157 protruding therefrom. FIGS. 1 and 2 illustrate the raised bosses 157 protruding above the upper edge 143 of the fastener boss 140 when the first flange 156 is disposed on the recessed mounting surface 142 thereof. The fastener bosses 157 bite into an electrically conductive trace on the printed circuit board 60 so as to provide improved electrical contact therebetween as discussed further below.

FIGS. 4b and 4c illustrate the curved portion 160 of the resilient electrical contact 150 having a bifurcating slot 162 forming separate curved portions 164 and 166, which protrude at least partially through the electrical contact opening 120 beyond the bottom side 118 of the rail member 110 as shown in FIGS. 1 and 2. The bifurcated curved portions 164 and 166 provide multiple contact points and thus increased electrical contact area with the chassis 70. The bifurcated curved portions 164 and 166 also lessen the tendency of the electrical contact 150 to lose its resiliency. Alternative embodiments may have multiple slots resulting in multiple curved portions.

The resilient electrical contact 150 also preferably includes a compression wave portion 170 disposed between the first end portion 152 and the curved portion 160 thereof. The compression wave portion 170 provides generally increased force, or bias, of the curved portion 160 of the resilient electrical contact 150 toward and against the chassis 70, thereby providing improved electrical contact therebetween, particularly when used in combination with the bifurcating slots 162 discussed above.

In the exemplary embodiment, the first end portion 152 of the resilient electrical contact 150 includes a leg portion 158 between the first flange 156 and the compression wave portion 170, wherein the leg portion 158 is disposed along, and preferably on, the outer side wall portion 144 of the fastener boss 140. The leg portion 158 extends more particularly downwardly between the first flange 156 and the compression wave portion 170, wherein the resilient electrical contact 150 transitions between the first flange 156 and the leg portion 158 at a circumferential portion of the fastener boss mounting surface 142 devoid of the upper edge portion 143, whereby the partially circumferential upper edge portion 143 preferably captures opposing sides of the resilient electrical contact 150 to further locate it on the rail member 110.

The downwardly extending leg portion 158 extends toward and terminates proximate, or at, the protruding step 123 of the opening 120 where the resilient electrical contact 150 transitions to the compression wave portion 170. The compression wave portion 170 includes a first wave leg 172 extending upwardly from the downwardly extending leg portion 158 and a transition 174 extending downwardly toward the curved portion 160 of the resilient electrical contact 150. The resilient electrical contact 150 may be readily and economically fabricated from a suitably conductive metal in a stamping operation.

FIG. 1 illustrates the rail member 110 and electrical contact assembly 150 prior to fastening thereof to a printed circuit board and installation on a chassis. Notably, the resilient electrical contact 150, and particularly the curved portion 160 thereof, protrudes relatively substantially beyond the lower side 118 of the rail member. FIG. 2 illustrates the rail member 110 and electrical contact 150 assembly fastened to the printed circuit board 60 by a fastener 50 disposed through an opening 62 therethrough. The fastener 50 clamps the board 60 to the fastener boss 140, and more particularly to the first flange 156 of the resilient electrical contact 150, which protrudes above the upper edge 143 of the fastener boss 140. An electrical trace portion 64 on a lower side 66 of the circuit board 60 is thus urged into electrical contact with the first flange 156 of the resilient electrical contact 150, wherein the first flange 156 preferably includes the one or more raised bosses 157 protruding therefrom for biting through any surface impurities resulting from oxidation or insulating coatings and into the electrical trace portion 64, thereby improving the electrical coupling between the resilient electrical contact 150 and the printed circuit board 60.

The exemplary Micro Tuflok® Rivet fastener 50 available from ITW Fastex, an Illinois Tool Works Company, Des Plaines, Ill., has generally a fastener body portion 80 retained in the rail member 110 and disposed through the fastener bore 146 and through the aperture 155 in the resilient electrical contact 150. The fastener body portion 80 also includes a radial flange 82 disposed and retained in a recess 148 on the bottom side 118 of the rail member 110 adjacent the fastener bore 146. More particularly, the fastener body portion 80 is captured in the recess 148 of the rail member 110 by one or more portions 149 extending over peripheral portions of the radial flange 82 of the fastener body portion 80. The portions 149 may be formed by ultrasonic welding or other processes for heating the rail member 110 thereabout, referred to generally as heat staking. Alternatively, the fastener body portion 80 may be retained in the recess 148 by other structure or adhesives.

The fastener body portion 80 also includes a bore 84 and a partially split resilient head having two or more resilient portions 86 protruding beyond the top side of the rail member 110, and more particularly beyond the mounting surface 142 of the fastener boss 140. The resilient portions 86 are flexible inwardly to reduce the radial dimension thereof when disposing the fastener body portion 80 into an opening 62 through the printed circuit board 60 shown in FIG. 2. Thereafter, the resilient portions 86 expand outwardly beyond the diameter of the opening 62 through the printed circuit board 60, thereby fastening the circuit board 60 to the rail member 110.

Figure 5:
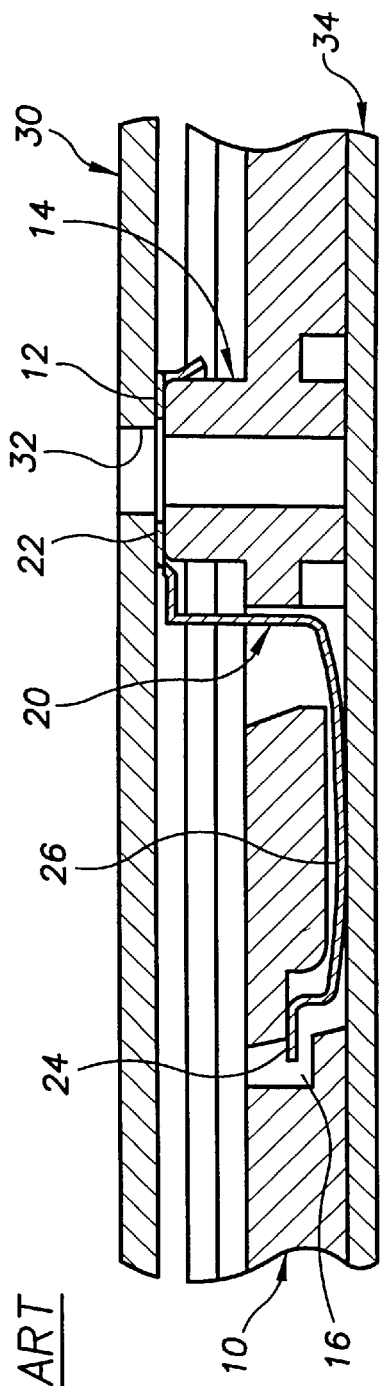
FIG. 5 is a prior art rail member and ground clip assembly.

A fastener pin 90 is retainably disposable in the bore 84 of the fastener body portion 80 from the bottom side 118 of the rail member 110. More particularly, a shaft portion 92 of the fastener pin 90 is insertable into the bore 84 of the fastener body portion 80 and between the resilient portions 86 of the partially split resilient head thereof to prevent the resilient portions 86 from flexing inwardly after the fastener body portion 80 is disposed through the opening 62 of the printed circuit board 60, securing the fastening of the printed circuit board 60 to the rail member 110. The Micro Tuflok® Rivet fastener 50 is useable alternatively with prior art rail member and ground clip assemblies of the type illustrated in FIG. 5, among others.

FIG. 2 illustrates that as the rail member 110 and electrical contact 150 assembly is slidably mounted onto the chassis 70, an upper surface 72 thereof engages the curved portion 160 of the resilient electrical contact 150, deformably urging it upwardly toward the opening 120 of the rail member 110, thereby providing an electrical coupling therebetween. In response thereto, the lower surface 134 of the rigid stud 130 reacts downwardly on the second end portion 154 generally, and more particularly on the opening 153 of the resilient contact 150, to prevent the second end 154 thereof from protruding above the upper surface 116 of the rail member 110 and proximate the lower side 66 of the printed circuit board 60, thereby preventing contact therewith or with any devices 68 mounted thereon and preventing a short circuit. The NLX Motherboard Specification defines a keep-out distance D between the upper side 116 of the rail member 110 and the lower side 66 of the printed circuit board 60 to be 0.140 inches, except in the areas of the fastener bosses 140 and support tabs 111.

FIG. 2 illustrates the compression wave portion 170 of the resilient electrical contact 150 under compression in response to deformation thereof to firmly bias the curved portion 160 against the chassis 70. More particularly, the curved portion 160 has a tendency to flatten and elongate toward the fastener boss 140 in response to the upwardly urging thereof by the chassis 70. The stud 130 and the edge 136 thereof prohibits substantial elongation of the curved portion 160 in the direction of the second end portion 114 of the rail member 110 generally. Thus as the curved portion 160 of the resilient electrical contact 150 is urged upwardly by the chassis 70, the compression wave portion 170 is compressed to permit flattening and elongation of the curved portion 160 toward the first end portion 112 of the rail member 110. The compressed compression wave portion 170 maintains a reactionary bias on the curved portion 160 of the resilient electrical contact 150 thereby urging the curved portion 160 thereof into relatively firm engagement with the chassis 70, thereby maintaining a robust electrical coupling therebetween. The NLX Motherboard Specification adopts the Class R Bond, per MIL-B-5087B, for the ground clip contact impedance, which is 2.5 milliohms, which is met or exceeded by the electrical contact 150 of the present invention.

FIG. 2 also illustrates the compressed compression wave portion 170 urging the leg portion 158 of the resilient electrical contact 150 laterally toward and into engagement with the outer side wall portion 144 of the fastener boss 140, thereby preventing the resilient contact 150, and more particularly the leg portion 158 thereof, from displacing upwardly toward the printed circuit board 60 in the "keep-out" zone defined between the upper surface 116 of the rail member 110 and the lower side 66 of the circuit board 60, thereby preventing contact between the leg portion 158 and the circuit board 60 or any electrical device 68 mounted thereon.

While the foregoing written description of the invention enables one of ordinary skill in the art to make and use what is at present considered to be the best mode of the invention, it will be appreciated and understood by those of ordinary skill the existence of variations, combinations, modifications and equivalents within the spirit and scope of the specific exemplary embodiments disclosed herein. The present invention is therefore to be limited not by the specific exemplary embodiments disclosed herein but by all embodiments within the scope of the appended claims.

What is claimed is:

1. A rail member and electrical contact assembly, useable for mechanically and electrically coupling a printed circuit board to a chassis, comprising:

an elongate rail member having a top side and a bottom side;

an electrical contact opening defined through said rail member and extending between said top side of said rail member and said bottom side of said rail member;

a fastener boss protruding from said top side of said rail member and located adjacent to said electrical contact opening defined within said rail member;

a stud mounted upon said rail member and protruding into said electrical contact opening defined within said rail member; and a resilient electrical contact having a first end portion mounted upon said fastener boss of said rail member, an opening defined within a second opposite end portion of said resilient electrical contact and within which said stud of said rail member is disposed such that said second end portion of said resilient electrical contact is mounted upon said rail member, and a curved portion disposed intermediate said first and second end portions of said resilient electrical contact and protruding at least partially through said electrical contact opening of said rail member and beyond said bottom side of said rail member.

2. The assembly of claim 1, the rail member having a longitudinal dimension with a first end and an opposing second end, the fastener boss disposed adjacent to a first interior side wall of the electrical contact opening located toward the first end of the rail member and the stud protruding from an opposing interior side wall of the electrical contact opening located toward the second end of the rail member, the first end portion of the resilient electrical contact having a first flange disposed on a mounting surface of the fastener boss.

3. The assembly of claim 1, the fastener boss having a mounting surface recessed below an upper edge portion of the fastener boss, the first end portion of the resilient electrical contact having a first flange disposed on the recessed mounting surface of the fastener boss, at least a portion of the first flange protruding above the upper edge of the fastener boss.

4. The assembly of claim 3, the first flange of the resilient electrical contact having a plurality of raised bosses protruding above the upper edge of the fastener boss.

5. The assembly of claim 1, the curved portion of the resilient electrical contact having a bifurcating slot forming separate curved portions protruding at least partially through the electrical contact opening beyond the bottom side of the rail member.

6. The assembly of claim 1, the resilient electrical contact having a compression wave portion between the first end portion and the curved portion of the resilient electrical contact.

7. The assembly of claim 1 is NLX Motherboard Specification compliant.

8. A rail member and electrical contact assembly, useable for mechanically and electrically coupling a printed circuit board to a chassis, comprising:

an elongate rail member having a top side and a bottom side;

an electrical contact opening defined through said rail member and extending between said top side of said rail member and said bottom side of said rail member;

a fastener boss protruding from said top side of said rail member and located adjacent to said electrical contact opening defined within said rail member;

a resilient electrical contact having a first end portion mounted upon said fastener boss of said rail member, an oppositely disposed second end portion mounted upon said rail member, a curved portion disposed intermediate said first and second end portions of said resilient electrical contact, and protruding at least partially through said electrical contact opening of said rail member and beyond said bottom side of said rail member, and a compression wave portion interposed between said first end portion and said curved portion of said resilient electrical contact for accommodating partial displacement of said curved portion of said resilient electrical contact, protruding at least partially through said electrical contact opening of said rail member, when said curved portion of said resilient electrical contact is engaged by a chassis.

9. The assembly of claim 8, the rail member having a longitudinal dimension with a first end and an opposing second end, the fastener boss disposed adjacent to a first side of the electrical contact opening located toward the first end of the rail member and the second end portion of the resilient electrical contact coupled to an opposing side of the electrical contact opening located toward the second end of the rail member, the first end portion of the resilient electrical contact having a first flange disposed on a mounting surface of the fastener boss.

10. The assembly of claim 9 further comprising a stud protruding into the electrical contact opening, the stud disposed through an opening in the resilient electrical contact to engagably couple the resilient electrical contact to the rail member.

11. The assembly of claim 8, the fastener boss having a mounting surface and a downwardly extending outer side wall portion forming a first interior side wall portion of the electrical contact opening in the rail member, the first end portion of the resilient electrical contact having a first flange and a downwardly extending leg portion between the first flange and the compression wave portion, first flange of the resilient electrical contact disposed on the mounting surface of the fastener boss, and the downwardly extending leg portion disposed along the downwardly extending outer side wall portion of the fastener boss.

12. The assembly of claim 11, the downwardly extending outer side wall portion of the fastener boss sloping at an angle toward a protruding step in the electrical contact opening, the downwardly extending leg portion of the resilient electrical contact terminating proximate the protruding step.

13. The assembly of claim 11, the compression wave portion of the resilient electrical contact extending upwardly from the downwardly extending leg portion and then extending downwardly toward the curved portion of the resilient electrical contact.

14. The assembly of claim 8, the curved portion of the resilient electrical contact having a bifurcating slot forming separate curved portions protruding at least partially through the electrical contact opening beyond the bottom side of the rail member.

15. The assembly of claim 10, the fastener boss having a mounting surface recessed below an upper edge portion of the fastener boss, the first end portion of the resilient electrical contact having a first flange disposed on the recessed mounting surface of the fastener boss, at least a portion of the first flange protruding above the upper edge of the fastener bore.

16. The assembly of claim 15, the first flange of the resilient electrical contact having a plurality of raised bosses protruding above the upper edge of the fastener boss.

17. A rail member and electrical contact assembly, useable for mechanically and electrically coupling a printed circuit board to a chassis, comprising:

an elongate rail member having a top side and a bottom side;

an electrical contact opening defined through said rail member and extending between said top side of said rail member and said bottom side of said rail member;

a fastener boss protruding from said top side of said rail member, located adjacent to said electrical contact opening defined within said rail member, and having a fastener bore extending between said top side of said rail member and said bottom side of said rail member;

a resilient electrical contact having a first end portion mounted upon said fastener boss of said rail member, a oppositely disposed second end portion mounted upon said rail member, and a curved portion disposed intermediate said first and second end portions of said resilient electrical contact and protruding at least partially through said electrical contact opening of said rail member and beyond said bottom side of said rail member;

a fastener body portion disposed through said fastener bore of said fastener boss and being retained within said rail member as a result of having an internal bore and a partially split resiliently expansible/contractible head protruding beyond said top side of said rail member; and a fastener pin retainably disposable within said internal bore of said fastener body portion, from said bottom side of said rail member and into said partially split resiliently expansible/contractible head of said fastener body portion, so as to maintain said resiliently expansible/contractible head of said fastener body portion in an expanded state.

18. The assembly of claim 17, the fastener body portion having a radial flange disposed and retained in a recess on the bottom side of the rail member adjacent the fastener bore, the radial flange portion is heat staked in the recess on the bottom side of the rail member.

19. The assembly of claim 17, a shaft portion of the fastener pin insertable into the bore of the fastener body portion and between resilient portions of the partially split resilient head to prevent the resilient portions from flexing inwardly.

20. The assembly of claim 17, the first end portion of the resilient electrical contact disposed on a mounting surface of the fastener boss and having an aperture aligned substantially with the fastener bore when the first end portion of the electrical contact is disposed on the mounting surface of the fastener boss, the fastener body portion disposed through the aperture in the resilient electrical contact.

* * * * *